(12) United States Patent
Kim et al.

(10) Patent No.: US 11,328,753 B2
(45) Date of Patent: May 10, 2022

(54) METHODS OF PERFORMING SELF-WRITE OPERATION AND SEMICONDUCTOR DEVICES USED THEREFOR

(71) Applicant: SK hynix Inc., Icheon-si Gyeonggi-do (KR)

(72) Inventors: Min O Kim, Seoul (KR); Min Wook Oh, Icheon-si Gyeonggi-do (KR); Yeong Han Jeong, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/912,310

(22) Filed: Jun. 25, 2020

(65) Prior Publication Data

US 2021/0257009 A1   Aug. 19, 2021

(30) Foreign Application Priority Data

Feb. 17, 2020   (KR) .......................... 10-2020-0019320

(51) Int. Cl.
  *G11C 7/10* (2006.01)
  *G11C 8/10* (2006.01)
  *G11C 7/22* (2006.01)
(52) U.S. Cl.
  CPC .............. *G11C 7/1006* (2013.01); *G11C 7/22* (2013.01); *G11C 8/10* (2013.01)
(58) Field of Classification Search
  CPC .................................................. G11C 11/4096
  USPC ..................................................... 711/E12.001
  See application file for complete search history.

(56) References Cited

U.S. PATENT DOCUMENTS

| | | | | |
|---|---|---|---|---|
| 6,041,379 A | * | 3/2000 | Sher | .................... G06F 13/1657 710/316 |
| 6,560,148 B2 | | 5/2003 | Takami et al. | |
| 2007/0260841 A1 | * | 11/2007 | Hampel | ............. G06F 13/1684 711/167 |
| 2021/0096948 A1 | * | 4/2021 | Gopalakrishnan | .......................... G06F 11/1068 |

FOREIGN PATENT DOCUMENTS

KR   1020160055549 A   5/2016

* cited by examiner

*Primary Examiner* — Min Huang
(74) *Attorney, Agent, or Firm* — William Park & Associates Ltd.

(57) ABSTRACT

A semiconductor device includes a read/write control circuit, a core circuit, and a data conversion circuit. The read/write control circuit generates a read strobe signal and a read address from an internal address/command signal based on an internal read command during a self-write operation, generates a write strobe signal after the read strobe signal is generated, and generates a write address from the internal address/command signal. The core circuit is synchronized with the read strobe signal to output read data stored in a bank selected by the read address and is synchronized with the write strobe signal to store write data into the bank or another bank which is selected by the write address. The data conversion circuit changes a pattern of the read data to generate the write data.

26 Claims, 16 Drawing Sheets

FIG. 7

| OPERATION | CLK | CS | ICA<1> | ICA<2> | ICA<3> | ICA<4> | ICA<5> | ICA<6> |
|---|---|---|---|---|---|---|---|---|
| SELF WRITE | Rising | H | L | L | H | H | H | X |
|  |  | L | BKA<1> | BKA<2> | BKA<3> | X | X | X |
| INTERNAL READ | Rising | H | L | H | L | L | H | CAD<1> |
|  |  | L | CAD<2> | CAD<3> | CAD<4> | CAD<5> | CAD<6> | CAD<7> |
| INTERNAL WRITE | Rising | H | L | H | L | H | L | CAD<1> |
|  |  | L | CAD<2> | CAD<3> | CAD<4> | CAD<5> | CAD<6> | CAD<7> |

METHODS OF PERFORMING SELF-WRITE OPERATION AND SEMICONDUCTOR DEVICES USED THEREFOR

CROSS-REFERENCE TO RELATED APPLICATIONS

The present application claims priority under 35 U.S.C. § 119(a) to Korean Application No. 10-2020-0019320, filed on Feb. 17, 2020, which is incorporated herein by reference in its entirety.

BACKGROUND

1. Technical Field

Embodiments of the present disclosure relate to methods of performing a self-write operation and semiconductor devices used therefor.

2. Related Art

In general, semiconductor devices such as dynamic random access memory (DRAM) devices may each include a plurality of banks with cell arrays which are selected by addresses. A semiconductor device may select one of the plurality of banks using an address and may perform a column operation for outputting data stored in a cell array included in the selected bank through input/output (I/O) lines.

In addition, the semiconductor device may perform an operation of copying and storing data having a specific pattern into the plurality of banks. The operation may be performed by copying external data and storing the copied data into the plurality of banks during a write operation.

SUMMARY

According to an embodiment, a semiconductor device includes a read/write control circuit, a core circuit, and a data conversion circuit. The read/write control circuit generates a read strobe signal which is enabled and a read address from an internal address/command signal when an internal read command is inputted to the read/write control circuit during a self-write operation. In addition, the read/write control circuit generates a write strobe signal which is enabled after the read strobe signal is generated and generates a write address from the internal address/command signal. The core circuit is synchronized with the read strobe signal to output read data stored in a bank selected by the read address and is synchronized with the write strobe signal to store write data into the bank or another bank which is selected by the write address. The data conversion circuit changes a pattern of the read data to generate the write data.

According to another embodiment, a semiconductor device includes a read/write control circuit, a core circuit, and a data conversion circuit. The read/write control circuit is configured to generate a read strobe signal from a self-write command during a self-write operation, is configured to generate a read address from an internal command/address signal based on an internal read command during the self-write operation, is configured to generate a write strobe signal from the read strobe signal during the self-write operation, and is configured to generate a write address from the internal address/command signal based on an internal write command and the self-write command during the self-write operation. The core circuit is configured to be synchronized with the read strobe signal to output read data stored in a first bank selected by the read address, is configured to be synchronized with the write strobe signal to store write data into the first bank or a second bank selected by the write address, and is configured to be synchronized with the write strobe signal to store the write data into the first bank or a third bank selected by the write address. The data conversion circuit is configured to change a pattern of the read data to generate the write data.

According to yet another embodiment, there is provided a method of performing a self-write operation. The method includes an internal read step, a data conversion step, and an internal write step. The internal read step includes entering an internal read operation of a self-write operation when an internal command/address signal has a predetermined logic level combination and generating a read strobe signal and a read address from the internal command/address signal. The data conversion step includes changing a pattern of read data outputted from a bank selected by the read address among a plurality of banks of a core circuit to generate write data. The internal write step includes entering a first internal write operation after the internal read step terminates and executing the first internal write operation that generates a write strobe signal and write address from the internal command/address signal and stores the write data into a bank selected by the write address among the plurality of banks of the core circuit.

BRIEF DESCRIPTION OF THE DRAWINGS

FIG. 7 is a table illustrating logic level combinations of a chip selection signal and an internal command/address signal for controlling operations of a semiconductor device according to an embodiment of the present disclosure.

DETAILED DESCRIPTION OF THE EMBODIMENTS

In the following description of the embodiments, when a parameter is referred to as being "predetermined," it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first," "second," "third," etc. are used herein to describe various elements, these elements should not be limited by these terms. These terms are only used to distinguish one element from another element. The terms are not meant to imply a number or order of elements. Thus, a first element in some embodiments could be termed a second element in other embodiments and vice versa without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
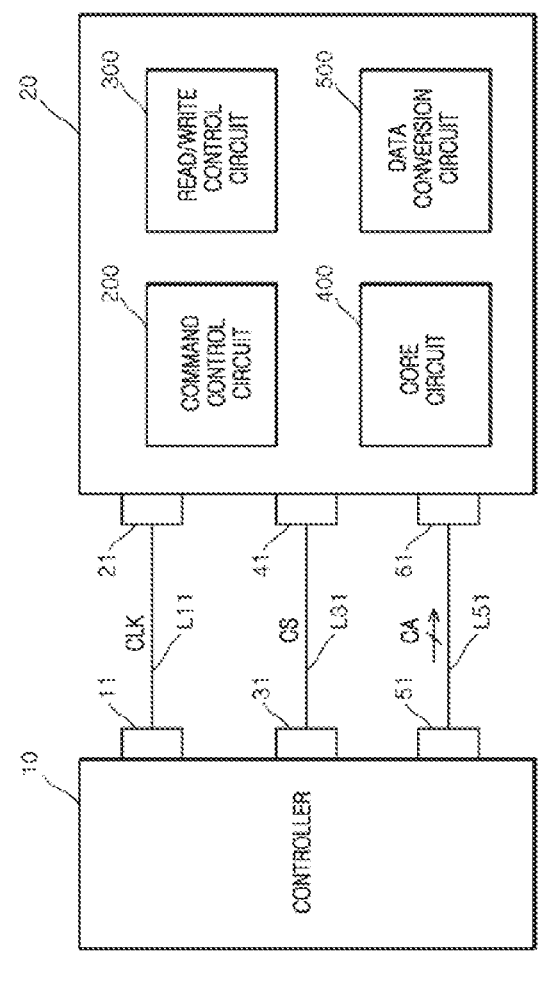
FIG. 1 is a block diagram illustrating a configuration of a semiconductor system according to an embodiment of the present disclosure.

FIG. 1 is a block diagram illustrating a configuration of a semiconductor system 1 according to an embodiment of the present disclosure. As illustrated in FIG. 1, the semiconductor system 1 may include a controller 10 and a semiconductor device 20. The semiconductor device 20 may include a command control circuit 200, a read/write control circuit 300, a core circuit 400, and a data conversion circuit 500.

The controller 10 may include a first control pin 11, a second control pin 31, and a third control pin 51. The semiconductor device 20 may include a first semiconductor pin 21, a second semiconductor pin 41, and a third semiconductor pin 61. The first control pin 11 and the first semiconductor pin 21 may be connected to each other by a first transmission line L11. The second control pin 31 and the second semiconductor pin 41 may be connected to each other by a second transmission line L31. The third control pin 51 and the third semiconductor pin 61 may be connected to each other by a third transmission line L51. The controller 10 may transmit a clock signal CLK to the semiconductor device 20 through the first transmission line L11 to control the semiconductor device 20. The controller 10 may transmit a chip selection signal CS to the semiconductor device 20 through the second transmission line L31 to control the semiconductor device 20. The controller 10 may transmit a command/address signal CA to the semiconductor device 20 through the third transmission line L51 to control the semiconductor device 20.

The command control circuit 200 may be synchronized with the clock signal CLK to generate a self-write command (SWT of FIG. 2) for performing a self-write operation according to the chip selection signal CS and the command/address signal CA. The command control circuit 200 may be synchronized with the clock signal CLK to generate an internal read command (IRD of FIG. 2) for performing an internal read operation of the self-write operation according to the chip selection signal CS and the command/address signal CA. The command control circuit 200 may be synchronized with the clock signal CLK to generate an internal write command (IWT of FIG. 2) for performing an internal write operation of the self-write operation according to the chip selection signal CS and the command/address signal CA. The self-write operation may be set as an operation that copies read data stored in the semiconductor device 20 and stores the copied read data into the semiconductor device 20 again.

The read/write control circuit 300 may generate a read strobe signal (RD_STR of FIG. 2) from the self-write command (SWT of FIG. 2) during the self-write operation. The read/write control circuit 300 may generate a read address (R_ADD<1:M> of FIG. 2) from the command/address signal CA based on the internal read command (IRD of FIG. 2) during the self-write operation. The read/write control circuit 300 may generate a write strobe signal (WT_STR of FIG. 2) from the read strobe signal (RD_STR of FIG. 2) during the self-write operation. The read/write control circuit 300 may generate a write address (W_ADD<1:M> of FIG. 2) from the command/address signal CA based on the internal write command (IWT of FIG. 2) during the self-write operation.

The core circuit 400 may be synchronized with the read strobe signal (RD_STR of FIG. 2) to output read data (R_ID of FIG. 2) stored in a bank selected by the read address (R_ADD<1:M> of FIG. 2) during the internal read operation of the self-write operation. The core circuit 400 may be synchronized with the write strobe signal (WT_STR of FIG. 2) to store write data (W_ID of FIG. 2) into a bank selected by the write address (W_ADD<1:M> of FIG. 2) during the internal write operation of the self-write operation.

The data conversion circuit 500 may generate the write data (W_ID of FIG. 2) from the read data (R_ID of FIG. 2) during the internal read operation of the self-write operation. The data conversion circuit 500 may change a pattern of the read data (R_ID of FIG. 2) to generate the write data (W_ID of FIG. 2) during the internal read operation of the self-write operation. The data conversion circuit 500 may generate the write data (W_ID of FIG. 2) without changing a pattern of the read data (R_ID of FIG. 2) during the internal read operation of the self-write operation.

Figure 2:
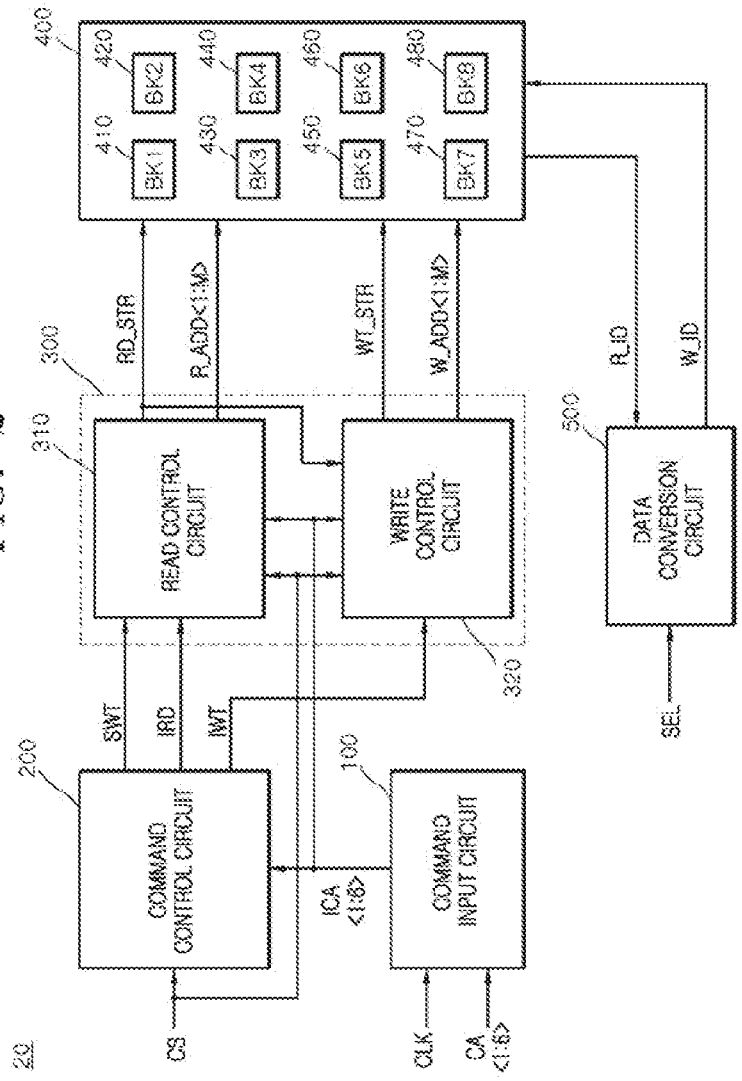
FIG. 2 is a block diagram illustrating a configuration of a semiconductor device included in the semiconductor system illustrated in FIG. 1.

FIG. 2 is a block diagram illustrating a configuration of the semiconductor device 20 shown in FIG. 1. As illustrated in FIG. 2, the semiconductor device 20 may include a command input circuit 100, the command control circuit 200, the read/write control circuit 300, the core circuit 400, and the data conversion circuit 500.

The command input circuit 100 may be synchronized with the clock signal CLK to generate first to sixth internal command/address signals ICA<1:6> from first to sixth command/address signals CA<1:6>. The command input circuit 100 may buffer the first to sixth command/address signals CA<1:6> in synchronization with a rising edge or a falling edge of the clock signal CLK to generate the first to sixth internal command/address signals ICA<1:6>.

The command control circuit 200 may generate the self-write command SWT for performing the self-write operation when the chip selection signal CS and the first to sixth internal command/address signals ICA<1:6> have a first logic level combination. The command control circuit 200 may generate the internal read command IRD for performing the internal read operation of the self-write operation when the chip selection signal CS and the first to sixth internal command/address signals ICA<1:6> have a second logic level combination. The command control circuit 200 may generate the internal write command IWT for performing the internal write operation of the self-write operation when the chip selection signal CS and the first to sixth internal command/address signals ICA<1:6> have a third logic level combination. The first to third logic level combinations of the chip selection signal CS and the first to sixth internal command/address signals ICA<1:6> will be described in detail with reference to FIG. 7 later.

The read/write control circuit 300 may include a read control circuit 310 and a write control circuit 320.

The read control circuit 310 may generate the read strobe signal RD_STR from the self-write command SWT during the internal read operation of the self-write operation. The read control circuit 310 may generate the read address R_ADD<1:M> from the first to sixth internal command/address signals ICA<1:6> based on the internal read command IRD during the internal read operation of the self-write operation.

The write control circuit 320 may generate the write strobe signal WT_STR from the read strobe signal RD_STR during the internal write operation of the self-write operation. The write control circuit 320 may generate the write address W_ADD<1:M> from the first to sixth internal command/address signals ICA<1:6> based on the internal write command IWT during the internal write operation of the self-write operation.

The read/write control circuit 300 may generate the read strobe signal RD_STR from the self-write command SWT during the self-write operation. The read/write control circuit 300 may generate the read address R_ADD<1:M> from the first to sixth internal command/address signals ICA<1:6> based on the internal read command IRD during the self-write operation. The read/write control circuit 300 may generate the write strobe signal WT_STR from the read strobe signal RD_STR during the self-write operation. The read/write control circuit 300 may generate the write address W_ADD<1:M> from the first to sixth internal command/address signals ICA<1:6> based on the internal write command IWT during the self-write operation. The first to sixth internal command/address signals ICA<1:6> for generating the read address R_ADD<1:M> and the write address W_ADD<1:M> will be described in detail with reference to FIG. 7 later.

The core circuit 400 may include a first bank 410, a second bank 420, a third bank 430, a fourth bank 440, a fifth bank 450, a sixth bank 460, a seventh bank 470, and an eighth bank 480. The core circuit 400 may be synchronized with the read strobe signal RD_STR to output the read data R_ID stored in one of the first to eighth banks 410~480, which is selected by the read address R_ADD<1:M>, during the internal read operation of the self-write operation. The core circuit 400 may be synchronized with the write strobe signal WT_STR to store the write data W_ID into one of the first to eighth banks 410~480, which is selected by the write address W_ADD<1:M>, during the internal write operation of the self-write operation. As used herein, the tilde "~" indicates a range of components. For example, "410~480" indicates the banks BK1 410, BK2 420, BK3 430, BK4 440, BK5 450, BK6 460, BK7 470, and BK8 480 shown in FIG. 2.

The data conversion circuit 500 may generate the write data W_ID from the read data R_ID during the internal read operation of the self-write operation. The data conversion circuit 500 may change a pattern of the read data R_ID based on a selection signal SEL to generate the write data W_ID during the internal read operation of the self-write operation. The data conversion circuit 500 may generate the write data W_ID without changing a pattern of the read data R_ID based on the selection signal SEL during the internal read operation of the self-write operation. The selection signal SEL may be a signal generated by a mode register set (MRS) included in the semiconductor device 20 and may be set to be enabled during an operation for changing a pattern of the read data R_ID.

Figure 3:
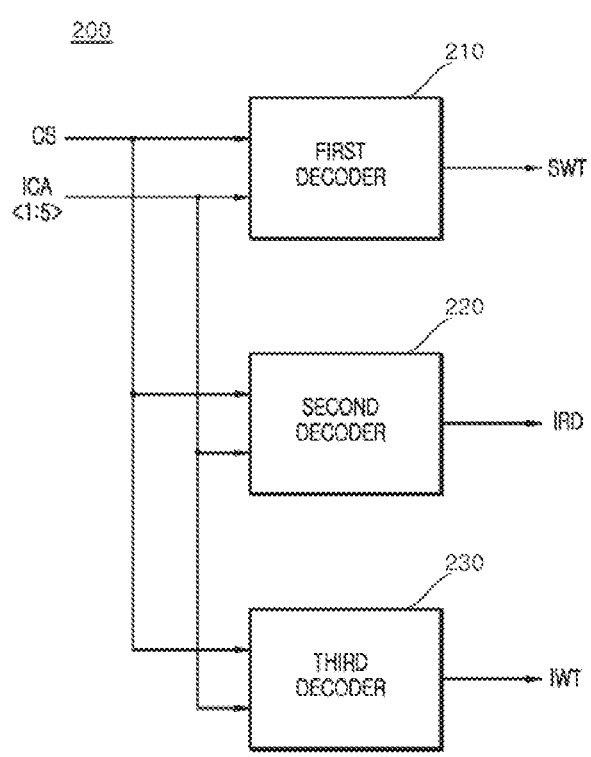
FIG. 3 is a block diagram illustrating a configuration of a command control circuit included in the semiconductor device illustrated in FIG. 2.

FIG. 3 is a block diagram illustrating a configuration of the command control circuit 200. As illustrated in FIG. 3, the command control circuit 200 may include a first decoder 210, a second decoder 220, and a third decoder 230.

The first decoder 210 may generate the self-write command SWT from the chip selection signal CS and the first to fifth internal command/address signals ICA<1:5>. The first decoder 210 may generate the self-write command SWT which is enabled when the chip selection signal CS and the first to fifth internal command/address signals ICA<1:5> have the first logic level combination.

The second decoder 220 may generate the internal read command IRD from the chip selection signal CS and the first to fifth internal command/address signals ICA<1:5>. The second decoder 220 may generate the internal read command IRD which is enabled when the chip selection signal CS and the first to fifth internal command/address signals ICA<1:5> have the second logic level combination.

The third decoder 230 may generate the internal write command IWT from the chip selection signal CS and the first to fifth internal command/address signals ICA<1:5>. The third decoder 230 may generate the internal write command IWT which is enabled when the chip selection signal CS and the first to fifth internal command/address signals ICA<1:5> have the third logic level combination.

Figure 4:
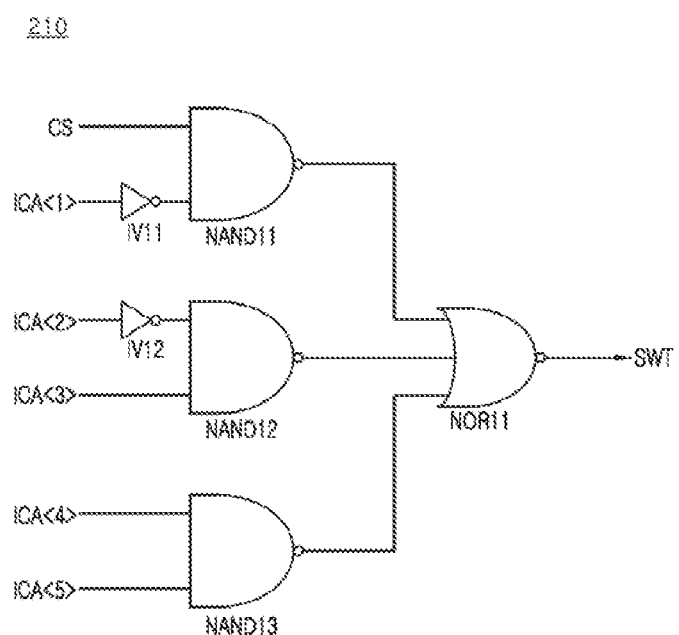
FIG. 4 is a circuit diagram illustrating a configuration of a first decoder included in the command control circuit illustrated in FIG. 3.

FIG. 4 is a circuit diagram illustrating a configuration of the first decoder 210. As illustrated in FIG. 4, the first decoder 210 may be realized using inverters IV11 and IV12; NAND gates NAND11, NAND12, and NAND13; and a NOR gate NOR11.

The first decoder 210 may generate the self-write command SWT which is enabled to have a logic "high" level when the chip selection signal CS has a logic "high" level, the first internal command/address signal ICA<1> has a logic "low" level, the second internal command/address signal ICA<2> has a logic "low" level, the third internal command/address signal ICA<3> has a logic "high" level, the fourth internal command/address signal ICA<4> has a logic "high" level, and the fifth internal command/address signal ICA<5> has a logic "high" level.

Figure 5:
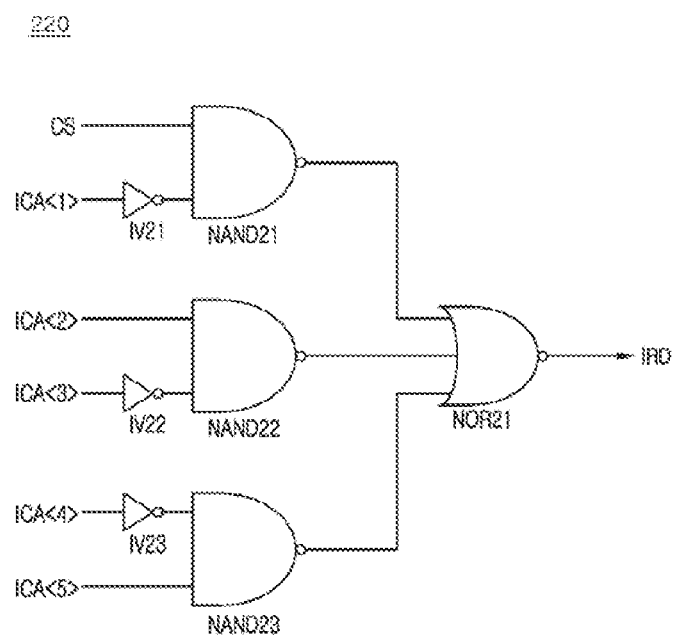
FIG. 5 is a circuit diagram illustrating a configuration of a second decoder included in the command control circuit illustrated in FIG. 3.

FIG. 5 is a circuit diagram illustrating a configuration of the second decoder 220. As illustrated in FIG. 5, the second decoder 220 may be realized using inverters IV21, IV22, and IV23; NAND gates NAND21, NAND22, and NAND23; and a NOR gate NOR21.

The second decoder 220 may generate the internal read command IRD which is enabled to have a logic "high" level when the chip selection signal CS has a logic "high" level, the first internal command/address signal ICA<1> has a logic "low" level, the second internal command/address signal ICA<2> has a logic "high" level, the third internal command/address signal ICA<3> has a logic "low" level, the fourth internal command/address signal ICA<4> has a logic "low" level, and the fifth internal command/address signal ICA<5> has a logic "high" level.

Figure 6:
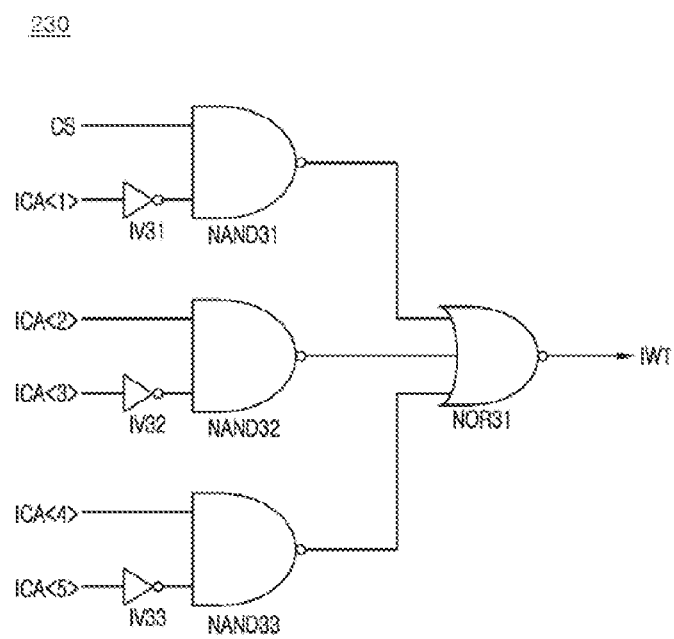
FIG. 6 is a circuit diagram illustrating a configuration of a third decoder included in the command control circuit illustrated in FIG. 3.

FIG. 6 is a circuit diagram illustrating a configuration of the third decoder 230. As illustrated in FIG. 6, the third decoder 230 may be realized using inverters IV31, IV32, and IV33; NAND gates NAND31, NAND32, and NAND33; and a NOR gate NOR31.

The second decoder 230 may generate the internal write command IWT which is enabled to have a logic "high" level when the chip selection signal CS has a logic "high" level, the first internal command/address signal ICA<1> has a logic "low" level, the second internal command/address signal ICA<2> has a logic "high" level, the third internal command/address signal ICA<3> has a logic "low" level, the fourth internal command/address signal ICA<4> has a logic "high" level, and the fifth internal command/address signal ICA<5> has a logic "low" level.

The first to third logic level combinations of the chip selection signal CS and the first to sixth internal command/address signals ICA<1:6> for performing the self-write operation, the internal read operation, and the internal write operation will be described in detail hereinafter with reference to FIG. 7.

First, the first logic level combination of the chip selection signal CS and the first to sixth internal command/address signals ICA<1:6> for performing the self-write operation will be described hereinafter.

The first logic level combination means that while the chip selection signal CS has a logic "high" level, the first to fifth internal command/address signals ICA<1:5> generated in synchronization with a rising edge of the clock signal CLK have a logic "low(L)" level, a logic "low(L)" level, a logic "high(H)" level, a logic "high(H)" level, and a logic "high(H)" level, respectively.

Next, the second logic level combination of the chip selection signal CS and the first to sixth internal command/address signals ICA<1:6> for performing the internal read operation will be described hereinafter.

The second logic level combination means that while the chip selection signal CS has a logic "high" level, the first to fifth internal command/address signals ICA<1:5> generated in synchronization with a rising edge of the clock signal CLK have a logic "low(L)" level, a logic "high(H)" level, a logic "low(L)" level, a logic "low(L)" level, and a logic "high(H)" level, respectively.

Next, the third logic level combination of the chip selection signal CS and the first to sixth internal command/address signals ICA<1:6> for performing the internal write operation will be described hereinafter.

The third logic level combination means that while the chip selection signal CS has a logic "high" level, the first to fifth internal command/address signals ICA<1:5> generated in synchronization with a rising edge of the clock signal CLK have a logic "low(L)" level, a logic "high(H)" level, a logic "low(L)" level, a logic "high(H)" level, and a logic "low(L)" level, respectively.

The first to sixth internal command/address signals ICA<1:6> for generating the read address R_ADD<1:M> and the write address W_ADD<1:M> will be described in detail hereinafter with reference to FIG. 7.

First, when the self-write operation is activated, the chip selection signal CS may be set to have a logic "low" level, the first internal command/address signal ICA<1> generated in synchronization with a rising edge of the clock signal CLK may be set as a first bit of BKA<1> of an address for selecting the first to eighth banks 310~380, the second internal command/address signal ICA<2> generated in synchronization with a rising edge of the clock signal CLK may be set as a second bit of BKA<2> of the address for selecting the first to eighth banks 310~380, and the third internal command/address signal ICA<3> generated in synchronization with a rising edge of the clock signal CLK may be set as a third bit of BKA<3> of the address for selecting the first to eighth banks 310~380. Although the present embodiment uses the first to third internal command/address signals ICA<1:3> to select the eight banks, the number of bits included in the internal command/address signal may be set to be different according to the embodiments.

Next, the first to sixth internal command/address signals ICA<1:6> for generating the read address R_ADD<1:M> during the internal read operation will be described in detail hereinafter.

During a period that the chip selection signal CS has a logic "high" level when the internal read operation is activated, the sixth internal command/address signal ICA<6> generated in synchronization with a rising edge of the clock signal CLK may be set as a first bit CAD<1> of an address for selecting a column path included in the first to eighth banks 310~380. In addition, during a period that the chip selection signal CS has a logic "low" level, the first internal command/address signal ICA<1> generated in synchronization with a rising edge of the clock signal CLK may be set as a second bit CAD<2> of the address for selecting the column path included in the first to eighth banks 310~380, the second internal command/address signal ICA<2> generated in synchronization with a rising edge of the clock signal CLK may be set as a third bit CAD<3> of the address for selecting the column path included in the first to eighth banks 310~380, the third internal command/address signal ICA<3> generated in synchronization with a rising edge of the clock signal CLK may be set as a fourth bit CAD<4> of the address for selecting the column path included in the first to eighth banks 310~380, the fourth internal command/address signal ICA<4> generated in synchronization with a rising edge of the clock signal CLK may be set as a fifth bit CAD<5> of the address for selecting the column path included in the first to eighth banks 310~380, the fifth internal command/address signal ICA<5> generated in synchronization with a rising edge of the clock signal CLK may be set as a sixth bit CAD<6> of the address for selecting the column path included in the first to eighth banks 310~380, and the sixth internal command/address signal ICA<6> generated in synchronization with a rising edge of the clock signal CLK may be set as a seventh bit CAD<7> of the address for selecting the column path included in the first to eighth banks 310~380. Although the present embodiment uses the internal command/address signal having 7 bits to select a column path of a bank which is selected during the internal read operation of the self-write operation, the number of bits included in the internal command/address signal for selecting the column path may be set to be different according to the embodiments.

The read address R_ADD<1:M> may be generated to be selectively enabled by the first to third addresses BKA<1:3> generated to select the first to eighth banks 310~380 during the self-write operation and by the first to seventh addresses CAD<1:7> for selecting a column path during the internal read operation.

Next, the first to sixth internal command/address signals ICA<1:6> for generating the write address W_ADD<1:M> during the internal write operation will be described in detail hereinafter.

During a period that the chip selection signal CS has a logic "high" level when the internal write operation is activated, the sixth internal command/address signal ICA<6> generated in synchronization with a rising edge of the clock signal CLK may be set as a first bit CAD<1> of an address for selecting a column path included in the first to eighth banks 310~380. In addition, during a period that the chip selection signal CS has a logic "low" level, the first internal command/address signal ICA<1> generated in synchronization with a rising edge of the clock signal CLK may be set as a second bit CAD<2> of the address for selecting the column path included in the first to eighth banks 310~380, the second internal command/address signal ICA<2> generated in synchronization with a rising edge of the clock signal CLK may be set as a third bit CAD<3> of the address for selecting the column path included in the first to eighth banks 310~380, the third internal command/address signal ICA<3> generated in synchronization with a rising edge of the clock signal CLK may be set as a fourth bit CAD<4> of the address for selecting the column path included in the first to eighth banks 310~380, the fourth internal command/address signal ICA<4> generated in synchronization with a rising edge of the clock signal CLK may be set as a fifth bit CAD<5> of the address for selecting the column path included in the first to eighth banks 310~380, the fifth internal command/address signal ICA<5> generated in synchronization with a rising edge of the clock signal CLK may be set as a sixth bit CAD<6> of the address for selecting the column path included in the first to eighth banks 310~380, and the sixth internal command/address signal ICA<6> generated in synchronization with a rising edge of the clock signal CLK may be set as a seventh bit CAD<7> of the address for selecting the column path included in the first to eighth banks 310~380. Although the present embodiment uses the internal command/address signal having 7 bits to select a column path of a bank which is selected during the internal write operation of the self-write operation, the number of bits included in the internal command/address signal for selecting the column path may be set to be different according to the embodiments.

The write address W_ADD<1:M> may be generated to be selectively enabled by the first to third addresses BKA<1:3> generated to select the first to eighth banks 310~380 during the self-write operation and by the first to seventh addresses CAD<1:7> for selecting a column path during the internal write operation.

Figure 8:
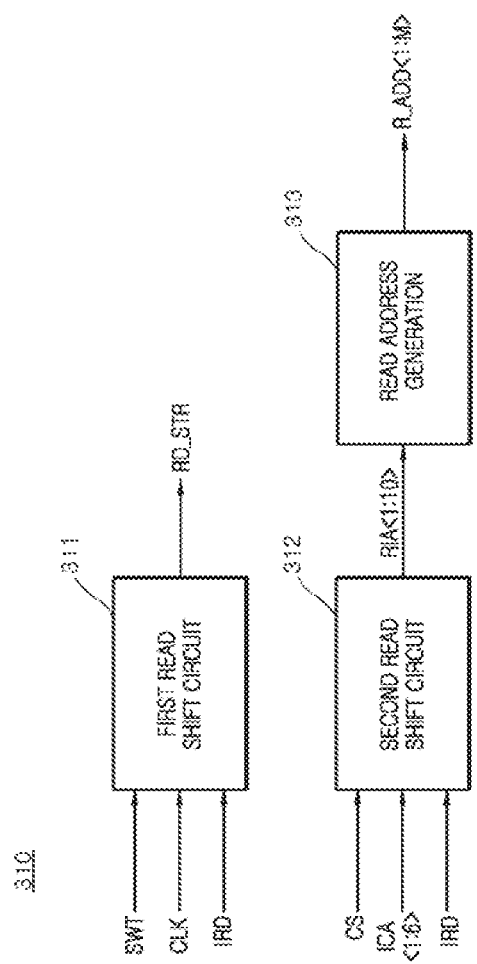
FIG. 8 is a block diagram illustrating a configuration of a read control circuit included in the semiconductor device illustrated in FIG. 2.

FIG. 8 is a block diagram illustrating a configuration of the read control circuit 310. As illustrated in FIG. 8, the read control circuit 310 may include a first read shift circuit 311, a second read shift circuit 312, and a read address generation circuit 313.

The first read shift circuit 311 may shift the self-write command SWT in synchronization with the clock signal CLK to generate the read strobe signal RD_STR. The first read shift circuit 311 may shift the self-write command SWT by a predetermined number of cycles of the clock signal CLK to generate the read strobe signal RD_STR. The first read shift circuit 311 may shift the internal read command IRD in synchronization with the clock signal CLK to generate the read strobe signal RD_STR. The first read shift circuit 311 may shift the internal read command IRD by the predetermined number of cycles of the clock signal CLK to generate the read strobe signal RD_STR. In the present embodiment, the first read shift circuit 311 may shift the self-write command SWT and the internal read command IRD by four cycles of the clock signal CLK to generate the read strobe signal RD_STR. The predetermined number of cycles of the clock signal CLK for shifting the self-write command SWT and the internal read command IRD may be set to be different according to the embodiments.

The second read shift circuit 312 may shift the first to third internal command/address signals ICA<1:3> inputted to the second read shift circuit 312 during a period that the chip selection signal CS has a logic "low" level to generate first to third read input address signals RIA<1:3> during the self-write operation. The second read shift circuit 312 may be synchronized with the internal read command IRD during the internal read operation to shift the sixth internal command/address signal ICA<6> during a period that the chip selection signal CS has a logic "high" level to generate a fourth read input address signal RIA<4>. The second read shift circuit 312 may be synchronized with the internal read command IRD during the internal read operation to shift the first to sixth internal command/address signals ICA<1:6> during a period that the chip selection signal CS has a logic "low" level to generate fifth to tenth read input address signals RIA<5:10>.

The read address generation circuit 313 may generate the read address R_ADD<1:M> from the first to tenth read input address signals RIA<1:10>. The read address generation circuit 313 may decode the first to tenth read input address signals RIA<1:10> to generate the read address R_ADD<1:M>, one of bit signals of which is selectively enabled. The number "M" of bits included in the read address R_ADD<1:M> may be set to be different according to the embodiments.

Figure 9:
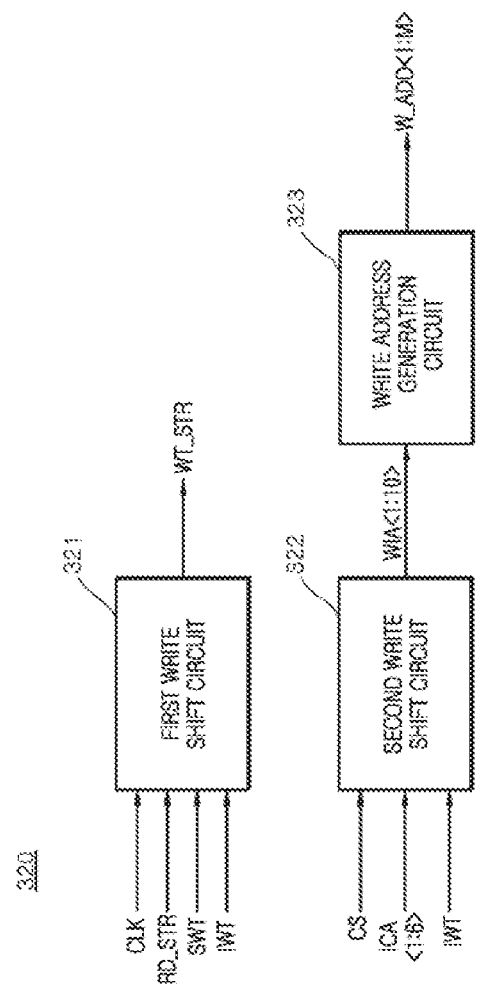
FIG. 9 is a block diagram illustrating a configuration of a write control circuit included in the semiconductor device illustrated in FIG. 2.

FIG. 9 is a block diagram illustrating a configuration of the write control circuit 320. As illustrated in FIG. 9, the write control circuit 320 may include a first write shift circuit 321, a second write shift circuit 322, and a write address generation circuit 323.

The first write shift circuit 321 may shift the read strobe signal RD_STR in synchronization with the clock signal CLK to generate the write strobe signal WT_STR. The first write shift circuit 321 may shift the read strobe signal RD_STR by a predetermined number of cycles of the clock signal CLK to generate the write strobe signal WT_STR. The first write shift circuit 321 may shift the self-write command SWT in synchronization with the clock signal CLK to generate the write strobe signal WT_STR. The first write shift circuit 321 may shift the self-write command SWT by the predetermined number of cycles of the clock signal CLK to generate the write strobe signal WT_STR. The first write shift circuit 321 may shift the internal write command IWT in synchronization with the clock signal CLK to generate the write strobe signal WT_STR. The first write shift circuit 321 may shift the internal write command IWT by the predetermined number of cycles of the clock signal CLK to generate the write strobe signal WT_STR. In the present embodiment, the first write shift circuit 321 may shift the read strobe signal RD_STR, the self-write command SWT, and the internal write command IWT by two cycles of the clock signal CLK to generate the write strobe signal WT_STR. The predetermined number of cycles of the clock signal CLK for shifting the read strobe signal RD_STR, the self-write command SWT, and the internal write command IWT may be set to be different according to the embodiments.

The second write shift circuit 322 may shift the first to third internal command/address signals ICA<1:3> during a period that the chip selection signal CS has a logic "low" level to generate first to third write input address signals WIA<1:3> during the self-write operation. The second write shift circuit 322 may be synchronized with the internal write command IWT during the internal write operation to shift the sixth internal command/address signal ICA<6> during a period that the chip selection signal CS has a logic "high" level to generate a fourth write input address signal WIA<4>. The second write shift circuit 322 may be synchronized with the internal write command IWT during the internal write operation to shift the first to sixth internal command/address signals ICA<1:6> during a period that the chip selection signal CS has a logic "low" level to generate fifth to tenth write input address signals WIA<5:10>.

The write address generation circuit 323 may generate the write address W_ADD<1:M> from the first to tenth write input address signals WIA<1:10>. The write address generation circuit 323 may decode the first to tenth write input address signals WIA<1:10> to generate the write address W_ADD<1:M>, one of bit signals of which is selectively enabled. The number "M" of bits included in the write address W_ADD<1:M> may be set to be different according to the embodiments.

Figure 10:
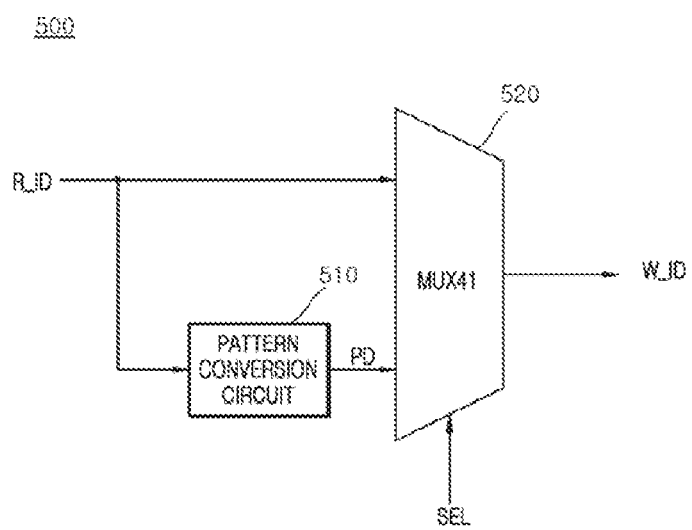
FIG. 10 is a block diagram illustrating a configuration of a data conversion circuit included in the semiconductor device illustrated in FIG. 2.

FIG. 10 illustrates a configuration of the data conversion circuit 500. As illustrated in FIG. 10, the data conversion circuit 500 may include a pattern conversion circuit 510 and a selection transfer circuit 520.

The pattern conversion circuit 510 may change a pattern of the read data R_ID to generate pattern data PD. The pattern conversion circuit 510 may invert or non-invert bit signals of the read data R_ID to generate the pattern data PD.

The selection transfer circuit 520 may be realized using a multiplexer (MUX41). The selection transfer circuit 520 may output any one of the read data R_ID and the pattern data PD as the write data W_ID based on the selection signal SEL. The selection transfer circuit 520 may output the read data R_ID as the write data W_ID when the selection signal SEL is disabled. The selection transfer circuit 520 may output the pattern data PD as the write data W_ID when the selection signal SEL is enabled. The selection signal SEL may be a signal generated by a mode register set (MRS) included in the semiconductor device 20 and may be set to be enabled during an operation for changing a pattern of the read data R_ID.

Figure 11:
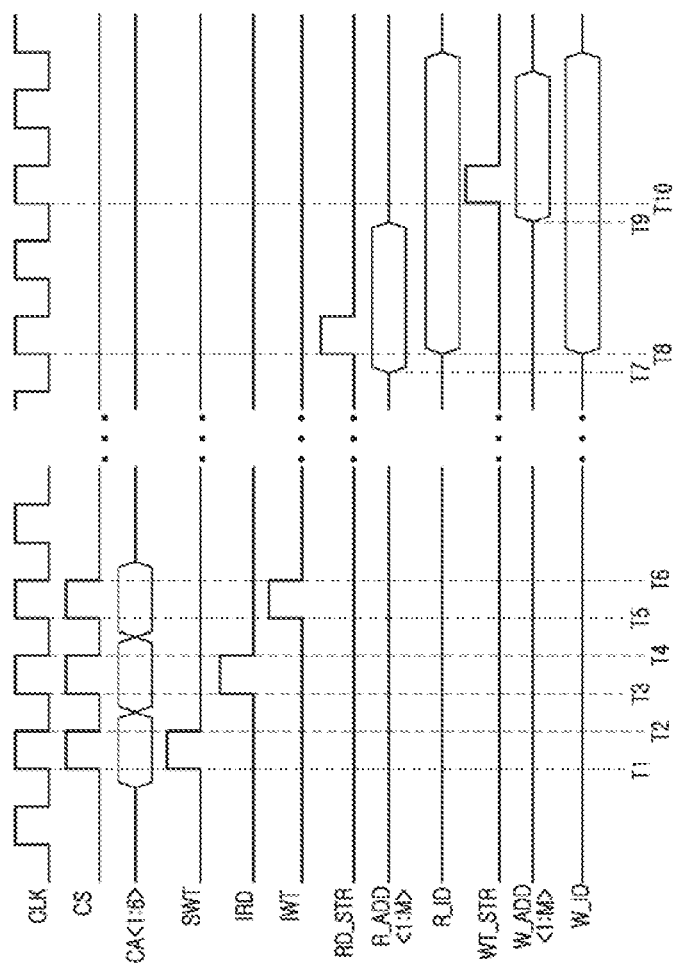
FIG. 11 is a timing diagram illustrating a self-write operation of a semiconductor device according to an embodiment of the present disclosure.

The self-write operation of the semiconductor device 20 will be described hereinafter with reference to FIG. 11 in conjunction with a case that a pattern of data is changed.

At a time "T1," the chip selection signal CS and the first to sixth command/address signals CA<1:6> having the first logic level combination may be inputted to the semiconductor device 20 in synchronization with a rising edge of the clock signal CLK.

The command input circuit 100 may be synchronized with the clock signal CLK to generate the first to sixth internal command/address signals ICA<1:6> from the first to sixth command/address signals CA<1:6>.

The first decoder 210 of the command control circuit 200 may generate the self-write command SWT which is enabled to have a logic "high" level by the chip selection signal CS and the first to sixth command/address signals CA<1:6> having the first logic level combination.

At a time "T2," the second read shift circuit 312 may shift the first to third internal command/address signals ICA<1:3> while the chip selection signal CS has a logic "low" level to generate the first to third read input address signals RIA<1:3>.

The second write shift circuit 322 may shift the first to third internal command/address signals ICA<1:3> while the chip selection signal CS has a logic "low" level to generate the first to third write input address signals WIA<1:3>.

At a time "T3," the chip selection signal CS and the first to sixth command/address signals CA<1:6> having the second logic level combination may be inputted to the semiconductor device 20 in synchronization with a rising edge of the clock signal CLK.

The command input circuit 100 may be synchronized with the clock signal CLK to generate the first to sixth internal command/address signals ICA<1:6> from the first to sixth command/address signals CA<1:6>.

The second decoder 220 of the command control circuit 200 may generate the internal read command IRD which is enabled to have a logic "high" level by the chip selection signal CS and the first to sixth command/address signals CA<1:6> having the second logic level combination.

The second read shift circuit 312 may shift the sixth internal command/address signal ICA<6> while the chip selection signal CS has a logic "high" level to generate the fourth read input address signal RIA<4>.

At a time "T4," the second read shift circuit 312 may shift the first to sixth internal command/address signals ICA<1:6> while the chip selection signal CS has a logic "low" level to generate the fifth to tenth read input address signals RIA<5:10>.

At a time "T5," the chip selection signal CS and the first to sixth command/address signals CA<1:6> having the third logic level combination may be inputted to the semiconductor device 20 in synchronization with a rising edge of the clock signal CLK.

The command input circuit 100 may be synchronized with the clock signal CLK to generate the first to sixth internal command/address signals ICA<1:6> from the first to sixth command/address signals CA<1:6>.

The third decoder 230 of the command control circuit 200 may generate the internal write command IWT which is enabled to have a logic "high" level by the chip selection signal CS and the first to sixth command/address signals CA<1:6> having the third logic level combination.

The second write shift circuit 322 may shift the sixth internal command/address signal ICA<6> while the chip selection signal CS has a logic "high" level to generate the fourth write input address signal WIA<4>.

At a time "T6," the second write shift circuit 322 may shift the first to sixth internal command/address signals ICA<1:6> while the chip selection signal CS has a logic "low" level to generate the fifth to tenth write input address signals WIA<5:10>.

At a time "T7," the read address generation circuit 313 may generate the read address R_ADD<1:M> from the first to tenth read input address signals RIA<1:10> which are generated at the points in time "T2," "T3," and "T4."

At a time "T8," the first read shift circuit 311 may be synchronized with the clock signal CLK to shift the self-write command SWT generated at the time "T1" to generate the read strobe signal RD_STR which is enabled to have a logic "high" level.

The core circuit 400 may be synchronized with the read strobe signal RD_STR to output the read data R_ID stored in a bank selected by the read address R_ADD<1:M>.

The pattern conversion circuit 510 of the data conversion circuit 500 may change a pattern of the read data R_ID to generate the pattern data PD. The selection transfer circuit 520 may output the pattern data PD as the write data W_ID based on the selection signal SEL.

At a time "T9," the write address generation circuit 323 may generate the write address W_ADD<1:M> from the first to tenth write input address signals WIA<1:10> which are generated at the points in time "T2," "T5," and "T6."

Meanwhile, the write address generation circuit 323 may be realized to generate the write address W_ADD<1:M> from the first to tenth write input address signals WIA<1:10> generated by the internal write command IWT which is generated at the time "T5," thereby performing the internal write operation.

At a time "T10," the first write shift circuit 321 may be synchronized with the clock signal CLK to shift the read strobe signal RD_STR generated at the time "T8" to generate the write strobe signal WT_STR which is enabled to have a logic "high" level.

The core circuit 400 may be synchronized with the write strobe signal WT_STR to store the write data W_ID into a bank selected by the write address W_ADD<1:M>.

As described above, a semiconductor device according to an embodiment may perform an internal read operation and an internal write operation to copy read data stored in a core circuit and to restore the copied read data as write data, during a self-write operation. As a result, it may be possible to improve operation speed of the semiconductor device and to reduce power consumption of the semiconductor device because no external data are required during the self-write operation.

Figure 12:
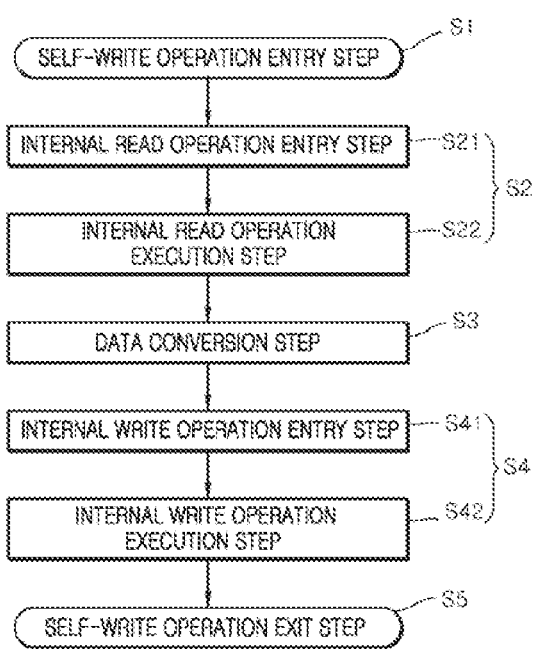
FIG. 12 is a flowchart illustrating a method of performing a self-write operation of a semiconductor device according to an embodiment of the present disclosure.

The self-write operation according to an embodiment will be described hereinafter with reference to FIG. 12.

The self-write operation may include a self-write operation entry step S1, an internal read step S2, a data conversion step S3, an internal write step S4, and a self-write operation exit step S5.

The self-write operation entry step S1 may be executed when the chip selection signal CS and the first to sixth internal command/address signals ICA<1:6> have the first logic level combination. At the self-write operation entry step S1, the self-write command SWT for performing the self-write operation may be generated.

The internal read step S2 may include an internal read operation entry step S21 and an internal read operation execution step S22.

The internal read operation entry step S21 may be executed when the chip selection signal CS and the first to sixth internal command/address signals ICA<1:6> have the second logic level combination. At the internal read operation entry step S21, the internal read command IRD for performing the internal read operation may be generated. At the internal read operation entry step S21, the read strobe signal RD_STR may be generated from the self-write command SWT. At the internal read operation entry step S21, the read address R_ADD<1:M> may be generated from the first to sixth internal command/address ICA<1:6> in synchronization with the internal read command IRD to perform the internal read operation.

The internal read operation execution step S22 may be synchronized with the read strobe signal RD_STR to output the read data R_ID stored in one of the first to eighth banks 410~480, which is selected by the read address R_ADD<1:M>.

The internal read step S2 may be synchronized with the read strobe signal RD_STR generated from the self-write command SWT to output the read data R_ID stored in one of the first to eighth banks 410~480, which is selected by the read address R_ADD<1:M> generated from the first to sixth internal command/address ICA<1:6>.

The data conversion step S3 may change a pattern of the read data R_ID based on the selection signal SEL to generate the write data W_ID.

The internal write step S4 may include an internal write operation entry step S41 and an internal write operation execution step S42.

The internal write operation entry step S41 may be executed when the chip selection signal CS and the first to sixth internal command/address signals ICA<1:6> have the third logic level combination. At the internal write operation entry step S41, the internal write command IWT for performing the internal write operation may be generated. At the internal write operation entry step S41, the write strobe signal WT_STR may be generated from the read strobe signal RD_STR. At the internal write operation entry step S41, the write address W_ADD<1:M> may be generated from the first to sixth internal command/address ICA<1:6> in synchronization with the internal write command IWT to perform the internal write operation.

The internal write operation execution step S42 may be synchronized with the write strobe signal WT_STR to store the write data W_ID into one of the first to eighth banks 410~480, which is selected by the write address W_ADD<1:M>.

The internal write step S4 may be synchronized with the write strobe signal WT_STR generated from the read strobe signal RD_STR to store the write data W_ID into one of the first to eighth banks 410~480, which is selected by the write address W_ADD<1:M> generated from the first to sixth internal command/address ICA<1:6>.

The self-write operation exit step S5 may be set as a step that the self-write operation terminates after the write data W_ID are stored.

Figure 13:
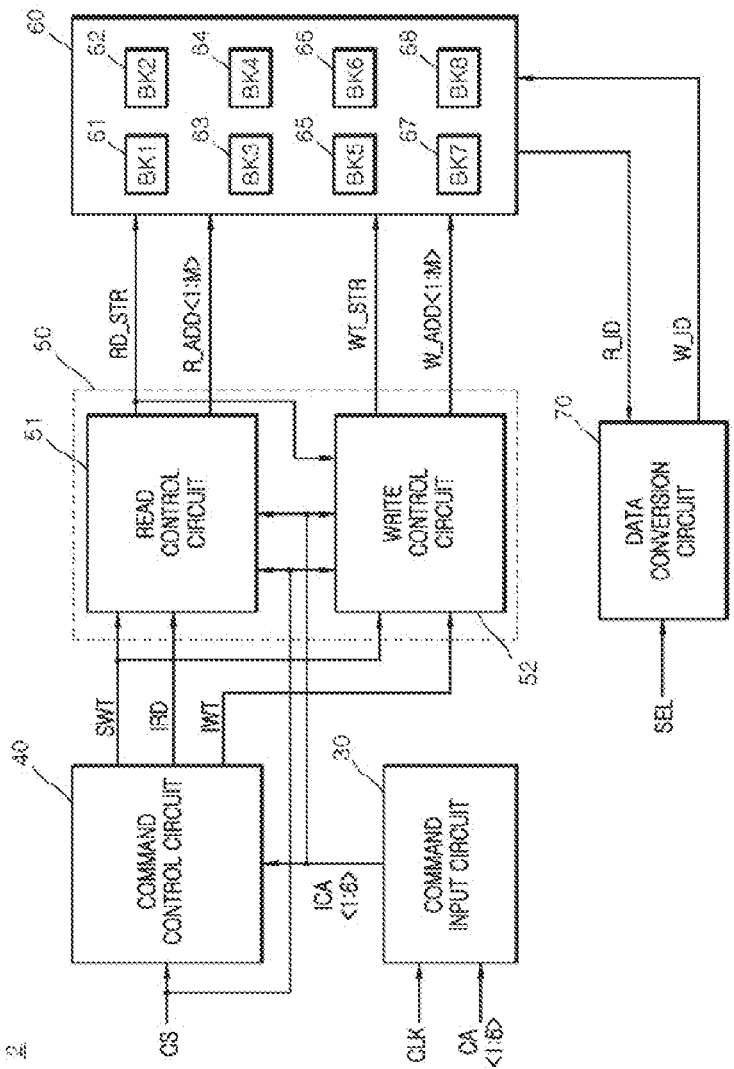
FIG. 13 is a block diagram illustrating a configuration of a semiconductor device according to another embodiment of the present disclosure.

FIG. 13 is a block diagram illustrating a configuration of a semiconductor device 2 according to another embodiment of the present disclosure. As illustrated in FIG. 13, the semiconductor device 2 may include a command input circuit 30, a command control circuit 40, a read/write control circuit 50, a core circuit 60, and a data conversion circuit 70.

The command input circuit 30 may be synchronized with a clock signal CLK to generate first to sixth internal command/address signals ICA<1:6> from first to sixth command/address signals CA<1:6>. The command input circuit 30 may buffer the first to sixth command/address signals CA<1:6> in synchronization with a rising edge or a falling edge of the dock signal CLK to generate the first to sixth internal command/address signals ICA<1:6>.

The command control circuit 40 may generate a self-write command SWT for performing a self-write operation when a chip selection signal CS and the first to sixth internal command/address signals ICA<1:6> have a first logic level combination. The command control circuit 40 may generate an internal read command IRD for performing an internal read operation of the self-write operation when the chip selection signal CS and the first to sixth internal command/address signals ICA<1:6> have a second logic level combination. The command control circuit 40 may generate an internal write command IWT for performing an internal write operation of the self-write operation when the chip selection signal CS and the first to sixth internal command/address signals ICA<1:6> have a third logic level combination. The command control circuit 40 may generate the internal write command IWT for performing the internal write operation again if the chip selection signal CS and the first to sixth internal command/address signals ICA<1:6> have the first logic level combination after the previous internal write command IWT is generated.

The read/write control circuit 50 may include a read control circuit 51 and a write control circuit 52.

The read control circuit 51 may generate a read strobe signal RD_STR from the self-write command SWT during the internal read operation of the self-write operation. The read control circuit 51 may generate read address R_ADD<1:M> from the first to sixth internal command/address signals ICA<1:6> based on the internal read command IRD during the internal read operation of the self-write operation.

The write control circuit 52 may generate a write strobe signal WT_STR from the read strobe signal RD_STR during the internal write operation of the self-write operation. The write control circuit 52 may generate write address W_ADD<1:M> from the first to sixth internal command/address signals ICA<1:6> when the internal write command IWT is inputted to the write control circuit 52 during the internal write operation of the self-write operation.

The read/write control circuit 50 may generate the read strobe signal RD_STR from the self-write command SWT during the self-write operation. The read/write control circuit 50 may generate the read address R_ADD<1:M> from the first to sixth internal command/address signals ICA<1:6> based on the internal read command IRD during the self-write operation. The read/write control circuit 50 may generate the write strobe signal WT_STR from the read strobe signal RD_STR during the self-write operation. The read/write control circuit 50 may generate the write address W_ADD<1:M> from the first to sixth internal command/address signals ICA<1:6> based on the internal write command IWT during the self-write operation. The read/write control circuit 50 may generate the write strobe signal WT_STR whenever a pulse of the internal write command IWT is created and may also generate the write address W_ADD<1:M> whenever a pulse of the internal write command IWT is created, but the read/write control circuit 50 may be realized using substantially the same circuit as the read/write control circuit 300 illustrated in FIG. 2. Thus, detailed descriptions of the read/write control circuit 50 will be omitted hereinafter.

The core circuit 60 may include a first bank 61, a second bank 62, a third bank 63, a fourth bank 64, a fifth bank 65, a sixth bank 66, a seventh bank 67, and an eighth bank 68. The core circuit 60 may be synchronized with the read strobe signal RD_STR to output read data R_ID stored in one of the first to eighth banks 61~68, which is selected by the read address R_ADD<1:M>, during the internal read operation of the self-write operation. The core circuit 60 may be synchronized with the write strobe signal WT_STR to store write data W_ID into one of the first to eighth banks 61~68, which is selected by the write address W_ADD<1:M>, during the internal write operation of the self-write operation.

The data conversion circuit 70 may generate the write data W_ID from the read data RID during the internal read operation of the self-write operation. The data conversion circuit 70 may change a pattern of the read data R_ID based on a selection signal SEL to generate the write data W_ID during the internal read operation of the self-write operation. The data conversion circuit 70 may generate the write data W_ID without changing a pattern of the read data R_ID based on the selection signal SEL during the internal read operation of the self-write operation. The data conversion circuit 70 may be realized using the same circuit as the data conversion circuit 500 illustrated in FIG. 2. Thus, detailed descriptions of the data conversion circuit 70 will be omitted hereinafter.

Figure 14:
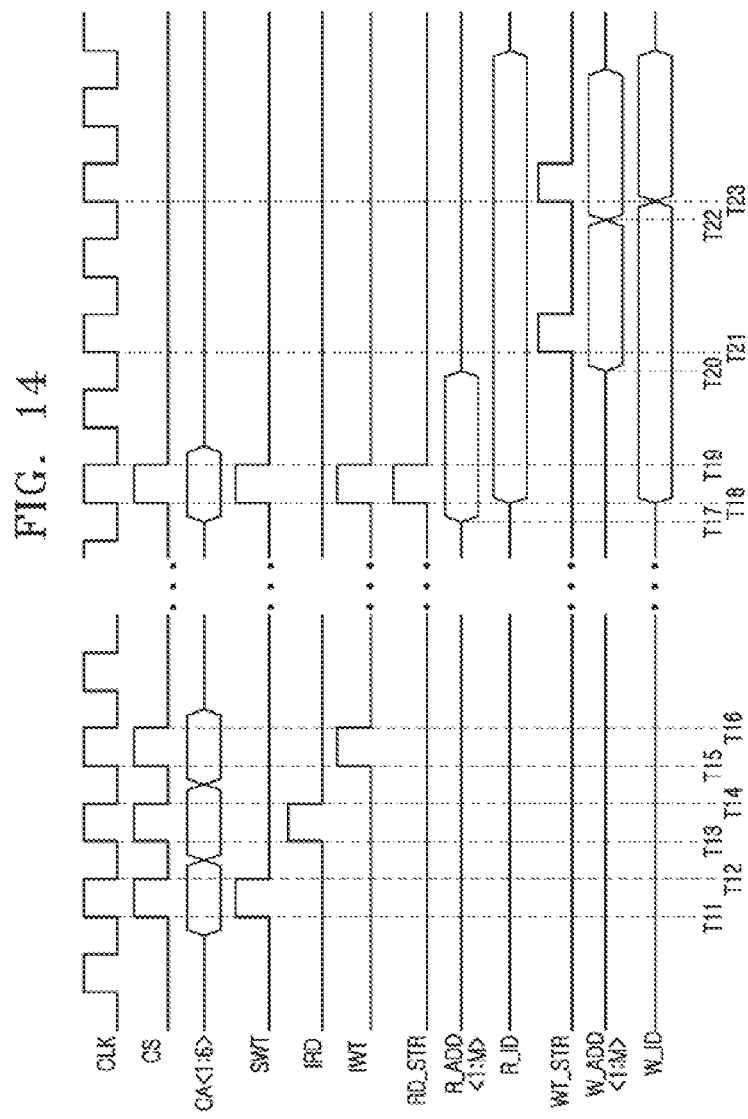
FIG. 14 is a timing diagram illustrating a self-write operation of a semiconductor device according to another embodiment of the present disclosure.

The self-write operation of the semiconductor device 2 will be described hereinafter with reference to FIG. 14 in conjunction with a case that a pattern of data is changed.

At a time "T11," the chip selection signal CS and the first to sixth command/address signals CA<1:6> having the first logic level combination may be inputted to the semiconductor device 2 in synchronization with a rising edge of the clock signal CLK.

The command input circuit 30 may be synchronized with the clock signal CLK to generate the first to sixth internal command/address signals ICA<1:6> from the first to sixth command/address signals CA<1:6>.

A first decoder (not shown) of the command control circuit 40 may generate the self-write command SWT which is enabled to have a logic "high" level by the chip selection signal CS and the first to sixth command/address signals CA<1:6> having the first logic level combination.

At a time "T12," a second read shift circuit (not shown) of the read control circuit 51 may shift the first to third internal command/address signals ICA<1:3> while the chip selection signal CS has a logic "low" level to generate the first to third read input address signals RIA<1:3>.

A second write shift circuit (not shown) of the write control circuit 52 may shift the first to third internal command/address signals ICA<1:3> while the chip selection signal CS has a logic "low" level to generate the first to third write input address signals WIA<1:3>.

At a time "T13," the chip selection signal CS and the first to sixth command/address signals CA<1:6> having the second logic level combination may be inputted to the semiconductor device 2 in synchronization with a rising edge of the clock signal CLK.

The command input circuit 30 may be synchronized with the clock signal CLK to generate the first to sixth internal command/address signals ICA<1:6> from the first to sixth command/address signals CA<1:6>.

A second decoder (not shown) of the command control circuit 40 may generate the internal read command IRD which is enabled to have a logic "high" level by the chip selection signal CS and the first to sixth command/address signals CA<1:6> having the second logic level combination.

The second read shift circuit (not shown) of the read control circuit 51 may shift the sixth internal command/address signal ICA<6> while the chip selection signal CS has a logic "high" level to generate the fourth read input address signal RIA<4>.

At a time "T14," the second read shift circuit (not shown) of the read control circuit 51 may shift the first to sixth internal command/address signals ICA<1:6> while the chip selection signal CS has a logic "low" level to generate the fifth to tenth read input address signals RIA<5:10>.

At a time "T15," the chip selection signal CS and the first to sixth command/address signals CA<1:6> having the third logic level combination may be inputted to the semiconductor device 2 in synchronization with a rising edge of the clock signal CLK.

The command input circuit 30 may be synchronized with the clock signal CLK to generate the first to sixth internal command/address signals ICA<1:6> from the first to sixth command/address signals CA<1:6>.

A third decoder (not shown) of the command control circuit 40 may generate the internal write command IWT which is enabled to have a logic "high" level by the chip selection signal CS and the first to sixth command/address signals CA<1:6> having the third logic level combination.

The second write shift circuit (not shown) of the write control circuit 52 may shift the sixth internal command/address signal ICA<6> while the chip selection signal CS has a logic "high" level to generate the fourth write input address signal WIA<4>.

At a time "T16," the second write shift circuit (not shown) of the write control circuit 52 may shift the first to sixth internal command/address signals ICA<1:6> while the chip selection signal CS has a logic "low" level to generate the fifth to tenth write input address signals WIA<5:10>.

At a time "T17," the chip selection signal CS and the first to sixth command/address signals CA<1:6> having the third logic level combination may be inputted to the semiconductor device 2 in synchronization with a rising edge of the clock signal CLK.

The command input circuit 30 may be synchronized with the clock signal CLK to generate the first to sixth internal command/address signals ICA<1:6> from the first to sixth command/address signals CA<1:6>.

A read address generation circuit (not shown) of the read control circuit 51 may generate the read address R_ADD<1:M> from the first to tenth read input address signals RIA<1:10> which are generated at the points in time "T12," "T13," and "T14."

At a time "T18," the chip selection signal CS and the first to sixth command/address signals CA<1:6> having the first logic level combination may be inputted to the semiconductor device 2 in synchronization with a rising edge of the clock signal CLK.

The command input circuit 30 may be synchronized with the clock signal CLK to generate the first to sixth internal command/address signals ICA<1:6> from the first to sixth command/address signals CA<1:6>.

The first decoder (not shown) of the command control circuit 40 may generate the self-write command SWT which is enabled to have a logic "high" level by the chip selection signal CS and the first to sixth command/address signals CA<1:6> having the first logic level combination.

A first read shift circuit (not shown) of the read control circuit 51 may be synchronized with the clock signal CLK to shift the self-write command SWT generated at the time "T1" to generate the read strobe signal RD_STR which is enabled to have a logic "high" level.

Meanwhile, the third decoder (not shown) of the command control circuit 40 may generate the internal write command IWT which is enabled to have a logic "high" level when the chip selection signal CS and the first to sixth internal command/address signals ICA<1:6> having the third logic level combination are inputted to the command control circuit 40.

The core circuit 60 may be synchronized with the read strobe signal RD_STR to output the read data R_ID stored in a bank selected by the read address R_ADD<1:M>.

A pattern conversion circuit (not shown) of the data conversion circuit 70 may change a pattern of the read data R_ID to generate the pattern data PD. A selection transfer circuit (not shown) of the data conversion circuit 70 may output the pattern data PD as the write data W_ID based on the selection signal SEL.

The second write shift circuit (not shown) of the write control circuit 52 may shift the sixth internal command/address signal ICA<6> while the chip selection signal CS has a logic "high" level to generate the fourth write input address signal WIA<4>.

At a time "T19," the second write shift circuit (not shown) of the write control circuit 52 may shift the first to sixth internal command/address signals ICA<1:6> while the chip selection signal CS has a logic "low" level to generate the fifth to tenth write input address signals WIA<5:10>.

At a time "T20," a write address generation circuit (not shown) of the write control circuit 52 may generate the write address W_ADD<1:M> from the first to tenth write input address signals WIA<1:10> which are generated at the points in time "T12," "T15," and "T16."

Meanwhile, the write address generation circuit (not shown) may be realized to generate the write address W_ADD<1:M> from the first to tenth write input address signals WIA<1:10> generated by the internal write command IWT which is generated at the time "T18," thereby performing the internal write operation.

At a time "T21," a first write shift circuit (not shown) of the write control circuit 52 may be synchronized with the clock signal CLK to shift the read strobe signal RD_STR generated at the time "T18" to generate the write strobe signal WT_STR which is enabled to have a logic "high" level.

The core circuit 60 may be synchronized with the write strobe signal WT_STR to store the write data W_ID into a bank selected by the write address W_ADD<1:M>.

At a time "T22," the write address generation circuit (not shown) of the write control circuit 52 may generate the write address W_ADD<1:M> from the first to tenth write input address signals WIA<1:10> which are generated at the points in time "T12," "T18," and "T19."

At a time "T23," the first write shift circuit (not shown) of the write control circuit 52 may be synchronized with the clock signal CLK to shift the read strobe signal RD_STR generated at the time "T18" to generate the write strobe signal WT_STR which is enabled to have a logic "high" level.

The core circuit 60 may be synchronized with the write strobe signal WT_STR to store the write data W_ID into a bank selected by the write address W_ADD<1:M>.

As described above, a semiconductor device according to another embodiment may successively perform an internal read operation and an internal write operation to copy read data stored in a core circuit and to restore the copied read data as write data, during a self-write operation. As a result, it may be possible to improve operation speed of the semiconductor device and to reduce power consumption of the semiconductor device because no external data are required during the self-write operation.

Figure 15:
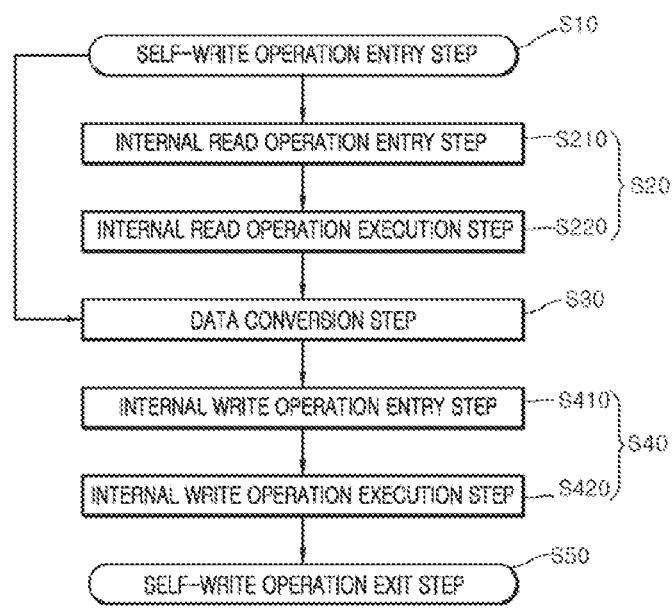
FIG. 15 is a flowchart illustrating a method of performing a self-write operation of a semiconductor device according to another embodiment of the present disclosure.

The self-write operation according to another embodiment will be described hereinafter with reference to FIG. 15.

The self-write operation may include a self-write operation entry step S10, an internal read step S20, a data conversion step S30, an internal write step S40, and a self-write operation exit step S50.

The self-write operation entry step S10 may be executed when the chip selection signal CS and the first to sixth internal command/address signals ICA<1:6> have the first logic level combination. At the self-write operation entry step S10, the self-write command SWT for performing the self-write operation may be generated.

The data conversion step S30 may be executed after the self-write operation entry step S10 if the chip selection signal CS and the first to sixth internal command/address signals ICS<1:6> have the first logic level combination after an internal write operation execution step 420 of the internal write step S40.

The internal read step S20 may include an internal read operation entry step S210 and an internal read operation execution step S220.

The internal read operation entry step S210 may be executed when the chip selection signal CS and the first to sixth internal command/address signals ICA<1:6> have the second logic level combination. At the internal read operation entry step S210, the internal read command IRD for performing the internal read operation may be generated. At the internal read operation entry step S210, the read strobe signal RD_STR may be generated from the self-write command SWT. At the internal read operation entry step S210, the read address R_ADD<1:M> may be generated from the first to sixth internal command/address ICA<1:6> in synchronization with the internal read command IRD to perform the internal read operation.

The internal read operation execution step S220 may be synchronized with the read strobe signal RD_STR to output the read data R_ID stored in one of the first to eighth banks 61~68, which is selected by the read address R_ADD<1:M>.

The internal read step S20 may be synchronized with the read strobe signal RD_STR generated from the self-write command SWT to output the read data R_ID stored in one of the first to eighth banks 61~68, which is selected by the read address R_ADD<1:M> generated from the first to sixth internal command/address ICA<1:6>.

The data conversion step S30 may change a pattern of the read data R_ID based on the selection signal SEL to generate the write data W_ID.

The internal write step S40 may include an internal write operation entry step S410 and an internal write operation execution step S420.

The internal write operation entry step S410 may be executed when the chip selection signal CS and the first to sixth internal command/address signals ICA<1:6> have the third logic level combination. At the internal write operation entry step S410, the internal write command IWT for performing the internal write operation may be generated. At the internal write operation entry step S410, the write strobe signal WT_STR may be generated from the read strobe signal RD_STR. At the internal write operation entry step S410, the write address W_ADD<1:M> may be generated from the first to sixth internal command/address ICA<1:6> in synchronization with the internal write command IWT to perform the internal write operation. The internal write operation entry step S410 may be executed again to generate the internal write command IWT for performing the internal write operation if the chip selection signal CS and the first to sixth internal command/address signals ICA<1:6> have the first logic level combination after the internal write command IWT is generated.

The internal write operation execution step S420 may be synchronized with the write strobe signal WT_STR to store the write data W_ID into one of the first to eighth banks 61~68, which is selected by the write address W_ADD<1:M>. The internal write operation execution step S420 may terminate after the internal write operation is repeatedly performed.

The internal write step S40 may be synchronized with the write strobe signal WT_STR generated from the read strobe signal RD_STR to store the write data W_ID into one of the first to eighth banks 61~68, which is selected by the write address W_ADD<1:M> generated from the first to sixth internal command/address ICA<1:6>. A bank selected by the write address W_ADD<1:M> at the internal write step S40 executed previously may be set to be different from a bank selected by the write address W_ADD<1:M> at the internal write step S40 executed currently.

The self-write operation exit step S50 may be set as a step that the self-write operation terminates after the write data W_ID are stored by a predetermined number of times.

Figure 16:
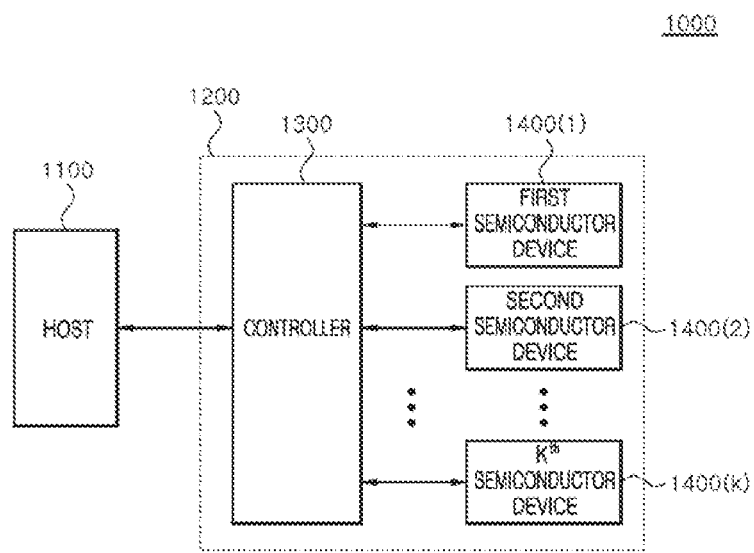
FIG. 16 is a block diagram illustrating a configuration of an electronic system including a semiconductor system according to an embodiment of the present disclosure.

FIG. 16 is a block diagram illustrating a configuration of an electronic system 1000 according to an embodiment of the present disclosure. As illustrated in FIG. 16, the electronic system 1000 may include a host 1100 and a semiconductor system 1200.

The host 1100 and the semiconductor system 1200 may transmit signals to each other using an interface protocol. The interface protocol used for communication between the host 1100 and the semiconductor system 1200 may include any one of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) such that the semiconductor devices 1400(K:1) perform the self-write operation, the internal read operation, and the internal write operation. Each of the semiconductor devices 1400(K:1) may perform the internal read operation and the internal write operation to copy read data stored in a core circuit and to restore the copied read data as write data, during the self-write operation. Each of the semiconductor devices 1400(K:1) may successively perform the internal read operation and the internal write operation to copy read data stored in a core circuit and to restore the copied read data as write data, during the self-write operation. As a result, it may be possible to improve operation speed of the semiconductor device and to reduce power consumption of the semiconductor device because no external data are required during the self-write operation.

The controller 1300 may be realized using the controller 10 illustrated in FIG. 1. Each of the semiconductor devices 1400(K:1) may be realized using the semiconductor device 20 illustrated in FIG. 2 or the semiconductor device 2 illustrated in FIG. 13. In some embodiments, each of the semiconductor devices 1400(K:1) may be realized using any one of a dynamic random access memory (DRAM), a phase change random access memory (PRAM), a resistive random access memory (RRAM), a magnetic random access memory (MRAM), and a ferroelectric random access memory (FRAM).

What is claimed is:
1. A semiconductor device comprising:
a read/write control circuit configured to generate a read strobe signal which is enabled and to generate a read address from an internal address/command signal when an internal read command is inputted to the read/write control circuit during a self-write operation, configured to generate a write strobe signal which is enabled after the read strobe signal is generated, and configured to generate a write address from the internal address/command signal;

a core circuit configured to be synchronized with the read strobe signal to output read data stored in a bank selected by the read address and configured to be synchronized with the write strobe signal to store write data into the bank or another bank which is selected by the write address; and a data conversion circuit configured to generate the write data with or without changing a pattern of the read data based on a selection signal for changing the pattern of the read data.

2. The semiconductor device of claim 1, wherein the self-write operation is an operation that copies the read data stored in the core circuit to restore the copied read data into the core circuit.

3. The semiconductor device of claim 1, wherein the read address and the write address are generated to have the same logic level combination or different logic level combinations.

4. The semiconductor device of claim 1, wherein the read/write control circuit includes:

a read control circuit configured to generate the read strobe signal from a self-write command which is enabled during the self-write operation and configured to generate the read address from the internal command/address signal based on the internal read command; and a write control circuit configured to delay the read strobe signal to generate a write strobe signal and configured to generate the write address from the internal command/address signal based on an internal write command.

5. The semiconductor device of claim 4, wherein the read control circuit includes:

a first read shift circuit configured to shift the self-write command and the internal read command in synchronization with a clock signal to generate the read strobe signal;

a second read shift circuit configured to generate a read input address signal from the internal command/address signal according to a logic level of a chip selection signal during the self-write operation and configured to be synchronized with the internal read command during an internal read operation to shift the internal command/address signal according to a logic level of the chip selection signal to generate the read input address signal; and a read address generation circuit configured to generate the read address from the read input address signal.

6. The semiconductor device of claim 4, wherein the write control circuit includes:

a first write shift circuit configured to shift the read strobe signal, the self-write command, and the internal write command in synchronization with a clock signal to generate the write strobe signal;

a second write shift circuit configured to generate a write input address signal from the internal command/address signal according to a logic level of a chip selection signal during the self-write operation and configured to be synchronized with the internal write command during an internal write operation to shift the internal command/address signal according to a logic level of the chip selection signal to generate the write input address signal; and a write address generation circuit configured to generate the write address from the write input address signal.

7. The semiconductor device of claim 1, wherein the data conversion circuit includes:

a pattern conversion circuit configured to change a pattern of the read data to generate pattern data; and a selection transfer circuit configured to output the read data or the pattern data as the write data based on the selection signal.

8. The semiconductor device of claim 1, further comprising a command control circuit configured to be synchronized with a clock signal to generate a self-write command, the internal read command, and an internal write command which are sequentially enabled according to a logic level combination of a chip selection signal and the internal command/address signal during the self-write operation.

9. The semiconductor device of claim 8, wherein the command control circuit includes:

a first decoder configured to generate the self-write command which is enabled when the internal command/address signal has a first logic level combination while the chip selection signal has a first logic level;

a second decoder configured to generate the internal read command which is enabled when the internal command/address signal has a second logic level combination while the chip selection signal has the first logic level; and a third decoder configured to generate the internal write command which is enabled when the internal command/address signal has a third logic level combination while the chip selection signal has the first logic level.

10. A semiconductor device comprising:

a read/write control circuit configured to generate a read strobe signal from a self-write command during a self-write operation, configured to generate a read address from an internal command/address signal based on an internal read command during the self-write operation, configured to generate a write strobe signal from the read strobe signal during the self-write operation, and configured to generate a write address from the internal address/command signal based on an internal write command and the self-write command during the self-write operation;

a core circuit configured to be synchronized with the read strobe signal to output read data stored in a first bank selected by the read address, configured to be synchronized with the write strobe signal to store write data into the first bank or a second bank selected by the write address, and configured to be synchronized with the write strobe signal to store the write data into the first bank or a third bank selected by the write address; and a data conversion circuit configured to generate the write data with or without changing a pattern of the read data based on a selection signal for changing the pattern of the read data.

11. The semiconductor device of claim 10, wherein the self-write operation is an operation that copies the read data stored in one bank of the core circuit to restore the copied read data into other banks of the core circuit.

12. The semiconductor device of claim 10, wherein the self-write command, the internal read command, and the internal write command are generated from the internal command/address signal when a chip selection signal has a first logic level; and wherein the read address and the write address are generated from the internal command/address signal while the chip selection signal has the first logic level and a second logic level.

13. The semiconductor device of claim 10,
wherein the read address is generated once to have the same logic level combination; and
wherein the write address is repeatedly generated to have the same logic level combination or different logic level combinations.

14. The semiconductor device of claim 10, wherein the read/write control circuit includes:
a read control circuit configured to generate the read strobe signal from the self-write command and configured to generate the read address from the internal command/address signal based on the internal read command; and
a write control circuit configured to delay the read strobe signal to generate the write strobe signal and configured to generate the write address from the internal command/address signal based on the internal write command.

15. The semiconductor device of claim 14, wherein the read control circuit includes:
a first read shift circuit configured to shift the self-write command and the internal read command in synchronization with a clock signal to generate the read strobe signal;
a second read shift circuit configured to generate a read input address signal from the internal command/address signal according to a logic level of a chip selection signal during the self-write operation and configured to be synchronized with the internal read command during an internal read operation to shift the internal command/address signal according to a logic level of the chip selection signal to generate the read input address signal; and
a read address generation circuit configured to generate the read address from the read input address signal.

16. The semiconductor device of claim 14, wherein the write control circuit includes:
a first write shift circuit configured to shift the read strobe signal, the self-write command, and the internal write command in synchronization with a clock signal to generate the write strobe signal;
a second write shift circuit configured to generate a write input address signal from the internal command/address signal according to a logic level of a chip selection signal during the self-write operation and configured to be synchronized with the internal write command during an internal write operation to shift the internal command/address signal according to a logic level of the chip selection signal to generate the write input address signal; and
a write address generation circuit configured to generate the write address from the write input address signal.

17. The semiconductor device of claim 10, wherein the data conversion circuit includes:
a pattern conversion circuit configured to change a pattern of the read data to generate pattern data; and
a selection transfer circuit configured to output the read data or the pattern data as the write data based on the selection signal.

18. The semiconductor device of claim 10, further comprising:

a command input circuit configured to be synchronized with a clock signal to generate the internal command/address signal from a command/address signal; and
a command control circuit configured to be synchronized with the clock signal to generate the self-write command, the internal read command, and an internal write command which are sequentially enabled according to a logic level combination of a chip selection signal and the internal command/address signal during the self-write operation.

19. The semiconductor device of claim 18, wherein the command control circuit includes:
a first decoder configured to generate the self-write command which is enabled when the internal command/address signal has a first logic level combination while the chip selection signal has a first logic level;
a second decoder configured to generate the internal read command which is enabled when the internal command/address signal has a second logic level combination while the chip selection signal has the first logic level; and
a third decoder configured to generate the internal write command which is enabled when the internal command/address signal has a third logic level combination while the chip selection signal has the first logic level and configured to generate the internal write command which is enabled again when the internal command/address signal has the first logic level combination after the internal write command is generated while the chip selection signal has the first logic level.

20. A self-write method comprising:
an internal read step of entering an internal read operation of a self-write operation when an internal command/address signal has a predetermined logic level combination and generating a read strobe signal and a read address from the internal command/address signal;
a data conversion step of generating write data with or without changing a pattern of read data outputted from a bank selected by the read address among a plurality of banks of a core circuit based on a selection signal, wherein the selection signal is a signal for changing the pattern of the read data; and
an internal write step of entering a first internal write operation after the internal read step terminates and executing the first internal write operation that generates a write strobe signal and write address from the internal command/address signal and stores the write data into a bank selected by the write address among the plurality of banks of the core circuit.

21. The self-write method of claim 20, wherein the self-write operation comprises:
copying the read data stored in one bank of the core circuit; and
restoring the copied read data into other banks of the core circuit.

22. The self-write method of claim 20, wherein the read address and the write address are generated to have the same logic level combination or different logic level combinations.

23. The self-write method of claim 20, wherein the internal read step includes:
an internal read operation entry step of generating a self-write command and an internal read command from the internal command/address signal while a chip selection signal has a first logic level and generating the read address from the internal command/address signal while the chip selection signal has the first logic level and a second logic level; and an internal read operation execution step of being synchronized with the read strobe signal to output the read data stored in a bank selected by the read address among the plurality of banks of the core circuit.

24. The self-write method of claim 20, wherein the internal write step includes:

an internal write operation entry step of generating an internal write command from the internal command/address signal while a chip selection signal has a first logic level and generating the write address from the internal command/address signal while the chip selection signal has the first logic level and a second logic level; and an internal write operation execution step of being synchronized with the write strobe signal to store the write data into a bank selected by the write address among the plurality of banks of the core circuit.

25. The self-write method of claim 20, wherein the internal write step further includes executing a second internal write operation that generates the write strobe signal and the write address from the internal command/address signal after the first internal write operation terminates and stores the write data into a bank selected by the write address among the plurality of banks of the core circuit.

26. The self-write method of claim 25, wherein the write address generated during the first internal write operation is different from the write address generated during the second internal write operation.

\* \* \* \* \*